United States Patent
Baum et al.

(10) Patent No.: US 9,779,818 B2
(45) Date of Patent: Oct. 3, 2017

(54) ADAPTATION OF HIGH-ORDER READ THRESHOLDS

(71) Applicant: APPLE INC., Cupertino, CA (US)

(72) Inventors: Barak Baum, Givatayim (IL); Alex Radinski, Hadera (IL); Eyal Gurgi, Petach Tikva (IL); Naftali Sommer, Rishon Lezion (IL); Tsafrir Kamelo, Rishon Lezion (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/794,862

(22) Filed: Jul. 9, 2015

(65) Prior Publication Data

US 2017/0011803 A1    Jan. 12, 2017

(51) Int. Cl.

| | |
|---|---|
| G11C 7/14 | (2006.01) |
| G11C 29/52 | (2006.01) |
| G11C 29/04 | (2006.01) |
| G11C 29/02 | (2006.01) |
| G11C 27/00 | (2006.01) |
| G11C 16/34 | (2006.01) |
| G11C 11/56 | (2006.01) |
| G06F 11/10 | (2006.01) |
| G06F 11/07 | (2006.01) |
| G11C 16/10 | (2006.01) |
| G11C 16/28 | (2006.01) |

(Continued)

(52) U.S. Cl.
CPC .............. *G11C 16/10* (2013.01); *G11C 7/14* (2013.01); *G11C 11/56* (2013.01); *G11C 11/5628* (2013.01); *G11C 11/5642* (2013.01); *G11C 16/28* (2013.01); *G11C 16/3418* (2013.01); *G11C 16/3459* (2013.01); *G11C 27/005* (2013.01); *G11C 29/021* (2013.01); *G11C 29/028* (2013.01); *G11C 29/42* (2013.01); *G11C 16/26* (2013.01); *G11C 2029/0409* (2013.01)

(58) Field of Classification Search
CPC . G11C 16/26; G11C 11/5642; G11C 16/3418; G11C 29/42; G11C 29/52; G11C 11/5628
USPC .......................................... 714/763
See application file for complete search history.

(56) References Cited

U.S. PATENT DOCUMENTS

| | | |
|---|---|---|
| 8,000,135 B1 | 8/2011 | Perlmutter et al. |
| 8,156,398 B2 | 4/2012 | Sommer et al. |
| 8,259,506 B1 | 9/2012 | Sommer et al. |

(Continued)

FOREIGN PATENT DOCUMENTS

| | | |
|---|---|---|
| JP | 2011100519 A | 5/2011 |
| JP | 2011165301 A | 8/2011 |

OTHER PUBLICATIONS

Tate et al., U.S. Appl. No. 14/847,037, filed Sep. 8, 2015.

(Continued)

*Primary Examiner* — James C Kerveros
(74) *Attorney, Agent, or Firm* — D.Kligler IP Services Ltd.

(57) ABSTRACT

A method includes storing data in memory cells by programming the memory cells with respective values. The memory cells are read in multiple readout operations that each compares the programmed values to at least first and second read thresholds, while keeping the first read threshold fixed throughout the readout operations and perturbing only the second read threshold between the readout operations. A preferred value for the second read threshold is estimated based on the multiple readout operations.

24 Claims, 3 Drawing Sheets

(51) Int. Cl.
*G11C 29/42* (2006.01)
*G11C 16/26* (2006.01)

(56) References Cited

U.S. PATENT DOCUMENTS

| | | | | |
|---|---|---|---|---|
| 8,305,811 | B2* | 11/2012 | Jeon | G11C 16/20 365/185.12 |
| 8,369,141 | B2 | 2/2013 | Sommer et al. | |
| 8,694,854 | B1 | 4/2014 | Dar et al. | |
| 8,773,904 | B2 | 7/2014 | Anholt et al. | |
| 8,830,746 | B2 | 9/2014 | Barkon et al. | |
| 8,850,292 | B2* | 9/2014 | Lee | G06F 11/1072 365/185.09 |
| 8,869,008 | B2 | 10/2014 | Baum et al. | |
| 9,009,390 | B2* | 4/2015 | Choi | G11C 16/02 365/189.011 |
| 2007/0297245 | A1 | 12/2007 | Mokhlesi | |
| 2009/0059698 | A1 | 3/2009 | Chang et al. | |
| 2011/0161775 | A1 | 6/2011 | Weingarten | |
| 2012/0008401 | A1* | 1/2012 | Katz | G11C 16/26 365/185.18 |
| 2012/0221917 | A1 | 8/2012 | Bueb et al. | |

OTHER PUBLICATIONS

Bez et al., "Introduction to Flash Memory", Proceedings of the IEEE, vol. 91, No. 4, pp. 489-502, Apr. 2003.

Eitan et al., "Multilevel Flash Cells and their Trade-Offs", Proceedings of the IEEE International Electron Devices Meeting (IEDM), pp. 169-172, Dec. 8-11, 1996.

Eitan et al.,"Can NROM, a 2-bit, Trapping Storage NVM Cell, Give a Real Challenge to Floating Gate Cells?" Proceedings of the 1999 International Conference on Solid State Devices and Materials (SSDM), pp. 522-524, Sep. 21-24, 1999.

Maayan et al., "A 512 Mb NROM Flash Data Storage Memory with 8 Mb/s Data Rate", Proceedings of the IEEE International Solid-State Circuits Conference, pp. 100-101, Feb. 3-7, 2002.

Kim et al., "Future Memory Technology including Emerging New Memories", Proceedings of the 24th International Conference on Microelectronics (MIEL), vol. 1, pp. 377-384, May 16-19, 2004.

\* cited by examiner

ADAPTATION OF HIGH-ORDER READ THRESHOLDS

TECHNICAL FIELD

Embodiments described herein relate generally to memory devices, and particularly to methods and systems for adjusting memory device read thresholds.

BACKGROUND

Several types of memory devices, such as Flash memories, use arrays of analog memory cells for storing data. Each analog memory cell holds a certain level of a given physical quantity such as an electrical charge or voltage, which represents the data stored in the cell. The levels of this physical quantity are also referred to as analog values. In Flash memory, for example, each memory cell holds a certain amount of electrical charge. The range of possible analog values is typically divided into regions, each region corresponding to a programming state or programming level that represents one or more data bit values. Data is typically read from Flash memory cells by comparing the analog values of the cells to one or more read thresholds.

Various techniques for adapting read thresholds are known in the art. For example, U.S. Pat. No. 8,369,141, whose disclosure is incorporated herein by reference, describes a method for operating a memory that includes a plurality of analog memory cells. The method includes storing data in the memory by writing first storage values to the cells. Second storage values are read from the cells, and a Cumulative Distribution Function (CDF) of the second storage values is estimated. The estimated CDF is processed so as to compute one or more thresholds. A memory access operation is performed on the cells using the one or more thresholds.

U.S. Pat. No. 8,000,135, whose disclosure is incorporated herein by reference, describes a method for data storage including storing data in a group of analog memory cells by writing into the memory cells in the group respective storage values, which program each of the analog memory cells to a respective programming state selected from a predefined set of programming states, including at least first and second programming states, which are applied respectively to first and second subsets of the memory cells, whereby the storage values held in the memory cells in the first and second subsets are distributed in accordance with respective first and second distributions. A first median of the first distribution is estimated, and a read threshold, which differentiates between the first and second programming states, is calculated based on the estimated first median. The data is retrieved from the analog memory cells in the group by reading the storage values using the calculated read threshold.

U.S. Pat. No. 8,259,506, whose disclosure is incorporated herein by reference, describes a method for data storage including storing multiple sets each including one or more read thresholds for use in reading data from a plurality of analog memory cells. The memory cells are arranged in multiple erasure blocks each including multiple pages, and each set of read thresholds is associated with a respective page in one of the erasure blocks. A first page, which belongs to a given erasure block and is not associated with any of the stored sets of read thresholds, is read by retrieving a stored set of read thresholds that is associated with a second page in the given erasure block, adapting the retrieved set of read thresholds to match the first page, and reading the first page using the adapted set of read thresholds.

U.S. Pat. No. 8,694,854, whose disclosure is incorporated herein by reference, describes a method for data storage including storing data in analog memory cells by programming the memory cells with respective analog input values. After storing the data, respective analog output values are read from the memory cells using multiple read thresholds, which define multiple ranges of the analog output values. Respective numbers of read errors in the data, corresponding to the analog output values falling in the ranges, are assessed. The stored data is recovered based on respective numbers of the read errors assessed in the ranges.

U.S. Pat. No. 8,773,904, whose disclosure is incorporated herein by reference, describes a method including storing data in a group of analog memory cells. The memory cells in the group are read using first read thresholds to produce first readout results, and re-read using second read thresholds to produce second readout results. Third read thresholds, which include at least one of the first read thresholds and at least one of the second read thresholds, are defined. Readout performance of the first, second and third read thresholds is evaluated based on the first and second readout results. The first, second or third read thresholds are selected based on the evaluated readout performance, and data recovery is performed using the selected read thresholds.

SUMMARY

An embodiment that is described herein provides a method including storing data in memory cells by programming the memory cells with respective values. The memory cells are read in multiple readout operations that each compares the values to at least first and second read thresholds, while keeping the first read threshold fixed throughout the readout operations and perturbing only the second read threshold between the readout operations. A preferred value for the second read threshold is estimated based on the multiple readout operations. In some embodiments, the values may be analog values.

In some embodiments, reading the memory cells includes applying the multiple readout operations to respective different groups of the memory cells. In an embodiment, the multiple readout operations include normal readout operations that read data in response to requests from a host.

In some embodiments, estimating the preferred value for the second read threshold includes estimating respective threshold-accuracy metrics for the readout operations, and estimating the preferred value based on the threshold-accuracy metrics. In an example embodiment, estimating the threshold-accuracy metrics includes assessing a respective number of read errors occurring in each of the readout operations.

In another embodiment, storing the data includes encoding the data with an Error Correction Code (ECC) that is defined by a set of check equations, and estimating the threshold-accuracy metrics includes assessing a respective number of the check equations that are satisfied by readout results of each of the readout operations. In yet another embodiment, storing the data includes encoding the data with an Error Correction Code (ECC), reading the memory cells includes decoding the ECC in a sequence of decoding iterations, and estimating the threshold-accuracy metrics includes assessing a respective number of the decoding iterations performed in each of the readout operations. In still another embodiment, storing the data includes encoding the data with an Error Correction Code (ECC), reading the memory cells includes decoding the ECC using a decoding scheme selected from multiple possible decoding schemes, and estimating the threshold-accuracy metrics includes assessing the decoding scheme selected in each of the readout operations.

In a disclosed embodiment, estimating the threshold-accuracy metrics includes assessing a first number of bit errors corrected from "1" to "0", and a second number of bit errors corrected from "0" to "1". In another embodiment, estimating the preferred value includes choosing a direction in which to adjust the second read threshold, based on the threshold-accuracy metrics. Additionally or alternatively, estimating the preferred value includes choosing an increment size by which to adjust the second read threshold, based on the threshold-accuracy metrics. In some embodiments, programming the memory cells includes mapping data values to the values in accordance with a mapping in which the values representing different data values are distinguishable by two or more read thresholds.

There is additionally provided, in accordance with an embodiment that is described herein, an apparatus including an interface and circuitry. The interface is configured to communicate with a memory that includes multiple memory cells. The circuitry is configured to store data in the memory cells by programming the memory cells with respective values, to read the memory cells in multiple readout operations that each compares the values to at least first and second read thresholds, while keeping the first read threshold fixed throughout the readout operations and perturbing only the second read threshold between the readout operations, and to estimate a preferred value for the second read threshold based on the multiple readout operations.

There is further provided, in accordance with an embodiment that is described herein, a method including storing data in memory cells by programming the memory cells with respective values. In response to a request for the data, the data is read from the memory cells in multiple readout operations that each compares the values to at least a read threshold, while perturbing the read threshold between the readout operations. A preferred value for the read threshold is estimated based on the multiple readout operations.

There is additionally provided, in accordance with an embodiment that is described herein, an apparatus including an interface and circuitry. The interface is configured to communicate with a memory that includes multiple memory cells. The circuitry is configured to store data in the memory by programming the memory cells with respective values, to read the data from the memory cells, in response to a request for the data, in multiple readout operations that each compares the values to at least a read threshold, while perturbing the read threshold between the readout operations, and to estimate a preferred value for the read threshold based on the multiple readout operations.

These and other embodiments will be more fully understood from the following detailed description of the embodiments thereof, taken together with the drawings in which:

DETAILED DESCRIPTION OF EMBODIMENTS

Overview

Figure 1:
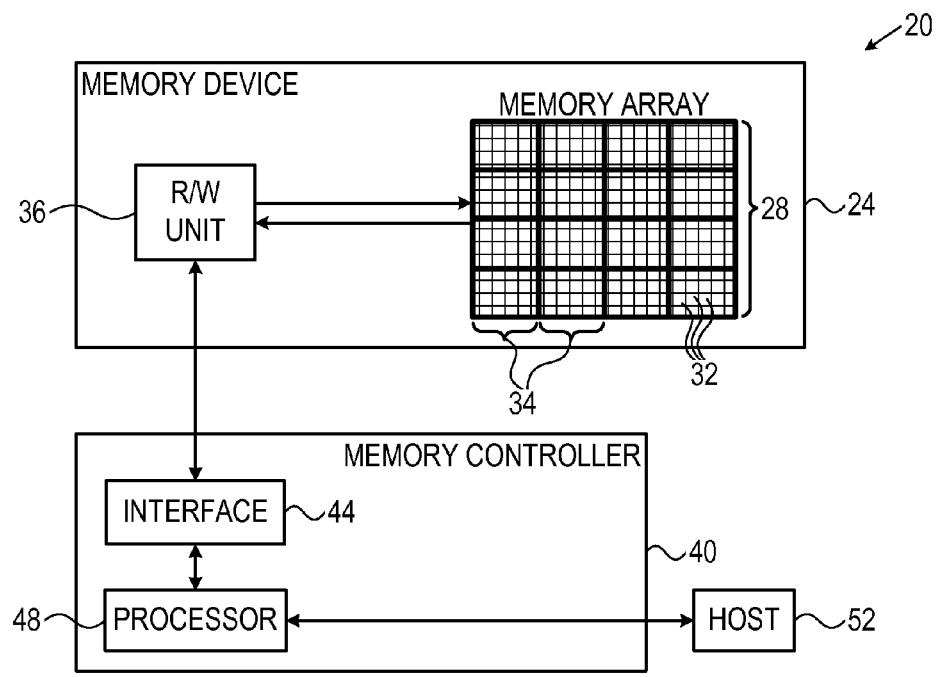
FIG. 1 is a block diagram that schematically illustrates a memory system, in accordance with an embodiment that is described herein.

Memory cells are typically read by comparing their values, which may be analog values, to certain read thresholds that are positioned between adjacent programming levels. In practice, the analog values of the memory cells tend to vary over time and from one memory cell group to another, and programming levels tend to shift, widen and even overlap. Therefore, it is important to track and set the read thresholds with high accuracy.

Embodiments described herein provide improved methods and systems for adaptively setting read thresholds. In some embodiments, a memory system comprises a memory device comprising multiple memory cells, and a memory controller that stores data in the memory device. The system uses a storage configuration having multiple bits per cell, such as Multi-Level Cell (MLC) or Triple-Level Cell (TLC). In such a configuration, the number of programming levels is larger than two, and the memory cells are read by comparing their storage values to multiple read thresholds.

Typically, the memory controller tracks the optimal positions of the read thresholds by calculating some error metric over the readout results, and adapting the read thresholds so as to minimize the error metric. Various error metrics can be used for this purpose, such as the number of errors per memory page. When a readout operation uses multiple read thresholds, however, it is difficult to isolate the individual contribution of each read threshold to the error metric, and decide which read threshold to adjust, in which direction and by what increment.

In some embodiments, the memory controller isolates the individual contribution of each read threshold to the error metric by performing a sequence of readout operations in which only one of the read thresholds is varied. The other read threshold or thresholds are kept fixed throughout the sequence.

Since only one of the read thresholds is perturbed from one readout operation to the next, changes in the error metric from one readout operation to another can be attributed to the positioning of this particular read threshold. The memory controller therefore estimates the preferred position of this read threshold based on the readout results. The memory controller may repeat the above process for adjusting different read thresholds.

Another possible way to isolate the individual contribution of each read threshold to the error metric is to perform one or more additional read operations, using read thresholds that are positioned between the read thresholds whose contributions are to be isolated. For example, isolation between the contributions of read thresholds of a high-order page can be achieved by reading a lower-order page mapped to the same word line. This sort of solution, however, incurs additional read operations that are not needed in the disclosed techniques.

In a typical implementation, the memory controller applies the disclosed process, of perturbing one read threshold at a time, to normal readout operations that read data from the memory device. In such embodiments, each readout operation in the sequence is typically applied to a different group of memory cells, e.g., to a word line in a memory block. This technique may introduce some additional error into the estimation process, due to variations between memory cell groups. This additional error is usually small, and is well worth the benefit of not having to add dedicated readout operations for the sake of read threshold tracking.

In other disclosed embodiments, the system uses a storage configuration having any desired number of bits per cell, e.g., Single-Level Cell (SLC), MLC or TLC. The memory cells in this configuration are read by comparing their storage values to one or more read thresholds. While performing normal readout operations in response to a request to retrieve stored data, the memory controller perturbs a given read threshold from one read operation to the next. The memory controller calculates a respective error metric for the readout results of each readout operation, and estimates a preferred value for the given read threshold based on the error metrics. This technique, of perturbing a read threshold during normal readout, may cause a slight increase in read error probability. This degradation, however, is usually negligible.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks 34. Each memory block 34 comprises multiple memory cells 32 which, in some embodiments, may be analog memory cells. In the context of the present patent application and in the claims, the term "analog memory cell" is used to describe any memory cell that holds a continuous, value, such as an analog value, of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as, values, analog values, analog storage values or storage values. The storage values may comprise, for example, threshold voltages or any other suitable kind of storage values. System 20 stores data in the memory cells 32 by programming the cells to assume respective programming states, which are also referred to as programming levels. The programming states are selected from a finite set of possible states, and each programming state corresponds to a certain nominal storage value. For example, a 3 bit/cell Triple-Level Cell (TLC) can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. Typically, memory controller 40 programs data in page units, but erases entire memory blocks 34.

The description that follows describes several example techniques for setting the positions of read thresholds for reading the data stored in memory cells 32. The disclosed techniques can be carried out by memory controller 40 and/or by R/W unit 36. For the sake of clarity, the description that follows refers to a particular division of functions between R/W unit 36 in the memory device and processor 48 in memory controller 40. Generally, however, the various tasks making-up the disclosed techniques can be divided between the memory controller and the R/W circuitry in any suitable manner, or performed by any one of these elements. Thus, in the context of the present patent application and in the claims, memory controller 40 and R/W circuitry 36 are referred to jointly as circuitry that carries out the disclosed techniques.

Figure 2:
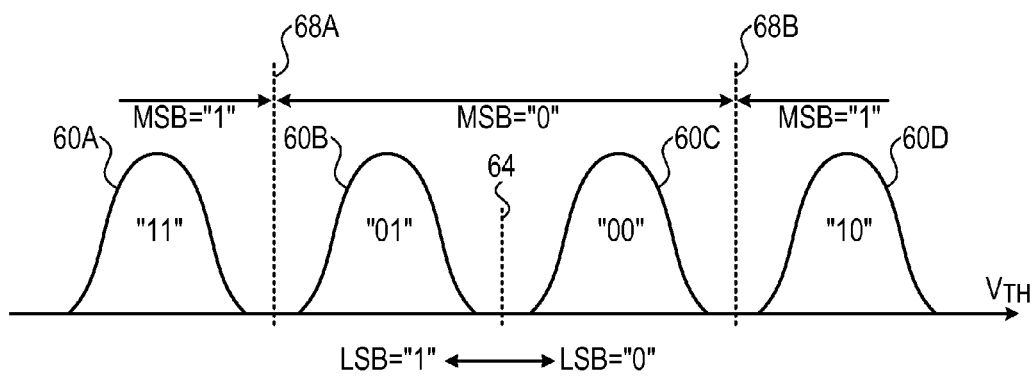
FIGS. 2 and 3A-3C are diagrams showing a process of read threshold adaptation, in accordance with an embodiment that is described herein.

FIG. 2 is a diagram showing the programming levels and read thresholds used for storing data in system 20, in accordance with an embodiment that is described herein. The example of FIG. 2 and the description that follows refer to a four-level MLC device that stores two bits per memory cell 32. This choice, however, is made purely by way of example. In alternative embodiments, the disclosed techniques can be used with any other suitable type of memory and with any other suitable configuration of programming levels and read thresholds.

FIG. 2 shows the distribution of threshold voltage ($V_{TH}$) in a group of memory cells 32, e.g., the cells along a given word line. The horizontal axis represents $V_{TH}$, and the vertical dimension represents the number of memory cells having a given $V_{TH}$. In the present example, the storage configuration maps the four two-bit data values "11", "01", "00" and "10" to four programming levels 60A ... 60D, respectively. Thus, for example, a memory cell is programmed by R/W unit 36 to a data value "10" by setting its $V_{TH}$ to fall in programming level 60D, and so on.

In this example, the right-hand-side bit in the two-bit data value is referred to as a Lower Significance Bit (LSB) and the left-hand-side bit in the two-bit data value is referred to as a Most Significance Bit (MSB). This convention, however, is not mandatory, and any other suitable convention or terminology can be used.

As can be seen in the figure, the memory cells in programming levels 60A and 60B have LSB="1", and the memory cells in programming levels 60C and 60D have LSB="0". Thus, R/W unit 36 may read the LSB data from a group of memory cells by comparing the cell threshold voltages to a single read threshold 64 that is positioned between programming levels 60B and 60C.

MSB readout, on the other hand, is more complex. In MSB programming (as in other high-order page programming), the multi-bit data values are mapped to analog values with a mapping in which the analog values representing different data values are distinguishable by multiple read thresholds. In the present example, the memory cells in programming levels 60A and 60D have MSB="1", and the memory cells in programming levels 60B and 60C have LSB="0". Thus, R/W unit 36 reads the MSB data from a group of memory cells by comparing the cell threshold voltages to two read thresholds 68A and 68B. Memory cells whose $V_{TH}$ falls below threshold 68A or above threshold 68B are read as MSB="1". Memory cells whose $V_{TH}$ falls between thresholds 68A and 68B are read as MSB="0".

Efficient Adaptation of High-Order Read Thresholds

In various embodiments, processor 48 may determine various metrics that estimate the accuracy with which the read thresholds are positioned. Such a metric is referred to herein as an "error metric" or "threshold-accuracy metric" and is typically determined based on the results of a readout operation that uses the read thresholds in question. The error metric may comprise various statistical measures of the readout results.

In one embodiment, the error metric comprises the number of errors in the readout results. For example, processor 48 may comprise an Error Correction Code (ECC) encoder and decoder, which encodes the data prior to storage and decodes the data read from memory. The decoder may provide an indication of the number of errors corrected during decoding. This number (also referred to as the number of bit-flips) can be used as an error metric—a large number of errors is indicative of poor threshold positioning, and vice versa.

In another embodiment, the ECC used for encoding the data is defined by a set of check equations, such as a Low Density Parity Check (LDPC) code. In this embodiment, the LDPC decoder may provide an indication of the number of check equations satisfied by the readout results. This number (also referred to as a "syndrome sum") can be used as an error metric—A large number of satisfied equations is indicative of accurate threshold positioning, and vice versa. Further aspects of the use of syndrome sum for read threshold adjustment are addressed in U.S. Patent Application Publication 2009/0199074, whose disclosure is incorporated herein by reference.

Additional types of threshold accuracy metrics are described in U.S. Pat. No. 8,773,904, cited above. Any of these metrics can be used for implementing the techniques described herein.

In yet another embodiment, the ECC decoder is an iterative decoder that decodes the ECC in a sequence of decoding iterations. Many LDPC decoders, for example, are iterative. Processor 48 may regard the number of iterations needed for successful decoding as an error metric—success after a small number of decoding iterations is indicative of accurate threshold positioning, and vice versa.

In still another embodiment, the ECC decoding process is performed in two stages. Initially, decoding is attempted using a relatively simple and low-power decoding scheme, e.g., using a hard decoder. If the attempt fails, decoding is re-attempted using a higher-performance decoder, e.g., a soft decoder, which is typically more complex and consumes more power. In this embodiment, processor 48 may regard the stage at which decoding succeeded as an error metric—successful decoding using the simpler decoder is indicative of accurate threshold positioning, whereas success only using the more complex decoder is indicative of poorer threshold positioning.

Further alternatively, processor 48 may evaluate and use any other suitable type of error metric or combination of metrics. When the readout results are obtained using multiple read thresholds, however, the error metric aggregates does not provide information as to the individual accuracy of each read threshold.

Figure 3:
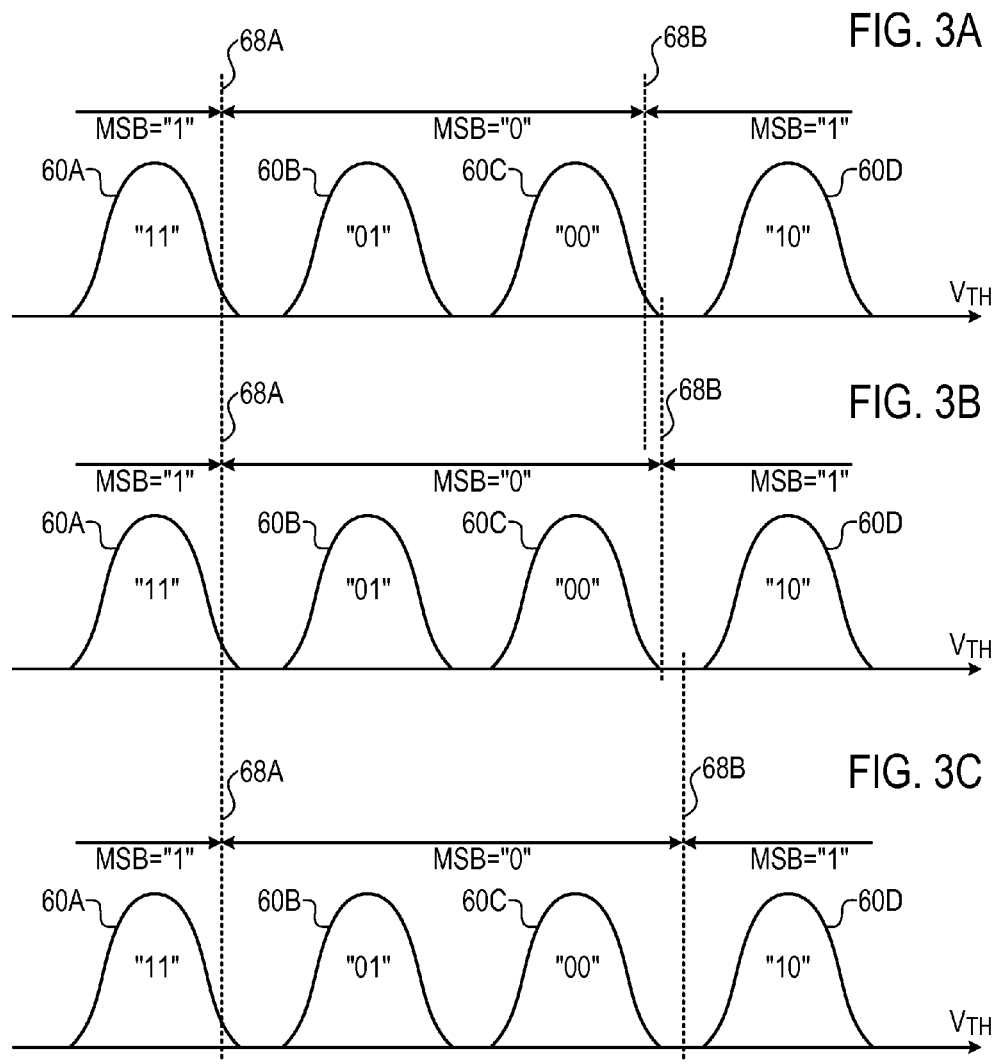

FIGS. 3A-3C are diagrams showing a process of read threshold adaptation, in accordance with an embodiment that is described herein. FIG. 3A shows an initial situation in which both read threshold 68A and 68B, which are used for reading the MSB data, are not positioned optimally.

As can be seen in the figure, both read thresholds are offset from the desired positions in the boundary regions between programming levels. When performing an MSB readout operation, the non-optimal positions of the two read thresholds will increase the error metric (e.g., number of errors) of the MSB readout results. At this point in time, processor 48 has no way of distinguishing between the individual contributions of read thresholds 68A and 68B to the error metric, and therefore has no way of deciding which threshold should be adjusted, in which direction and by what increment.

In the present example, processor 48 isolates the individual contribution of read threshold 68B to the error metric, by performing additional MSB readout operations in which threshold 68A is kept fixed and threshold 68B is perturbed. The read threshold settings used in two such readout operations are shown in FIGS. 3B and 3C.

Processor 48 calculates a respective error metric over the results of each readout operation. Since only threshold 68B was perturbed, processor 48 assumes that changes in the error metric from one readout operation to another are caused by the different positions of threshold 68B. Using this information, processor 48 is able to adjust read threshold 68B to its optimal position.

In some embodiments, processor 48 repeats a process similar to the process of FIGS. 3A-3C for setting threshold 68A. In the repeated process, threshold 68B is kept fixed and threshold 68A is perturbed.

Typically, the MSB readout operations shown in FIGS. 3A-3C are normal data readout operations, e.g., in response to requests for data from host 52, not dedicated operations for the sake of read threshold adaptation. Processor 48 makes dual use of these readout operations, and uses them both for data readout and for threshold adjustment. This process is typically performed per memory block.

In these embodiments, each of the readout operations is performed on a different group of memory cells, e.g., on different word lines. The different memory cell groups typically store different data, and often have some variation in characteristics and performance. Therefore, some of the differences between the error metrics may be due to the fact that they are calculated over different memory cell groups. Processor 48 may compensate for this additional distortion in various ways, for example by repositioning the read threshold based on a sufficiently large number of readout operations.

Processor 48 may perform the above process on an on-going basis, for tracking the read threshold positions during normal operation. In an example flow, processor 48 examines a certain number of most-recent error metrics relating to a given threshold, and uses them to decide on the next position for that threshold.

Consider, for example, a scenario in which processor 48 shifts the read threshold incrementally in a certain direction from one read operation to the next. If the most-recent error metrics exhibit a monotonically decreasing trend, processor 48 may decide that the direction of adjustment is correct, and continue incrementing the read threshold in the same direction. If, on the other hand, the most-recent error metrics exhibit an increasing trend, processor 48 may decide that the direction of adjustment in the most-recent readout operations is wrong, and start adjusting the read threshold in the opposite direction.

In some embodiments, processor 48 may set the size of the increment by which the threshold is adjusted from one readout operation to the next, based on the magnitude of the error metric. A large error metric typically indicates that the current threshold position is far away from the optimal position, and the increment should therefore be large. A small metric typically indicates that the current position is close to optimal, and therefore a small increment is preferable.

In some embodiments, processor 48 perturbs the read threshold in only some of the readout operations, not every readout operation. For example, the processor may use only every second read operation, or generally every $N^{th}$ readout operation, for threshold tracking. In this manner, processor 48 may trade tracking rate and computational complexity as desired.

Figure 4:
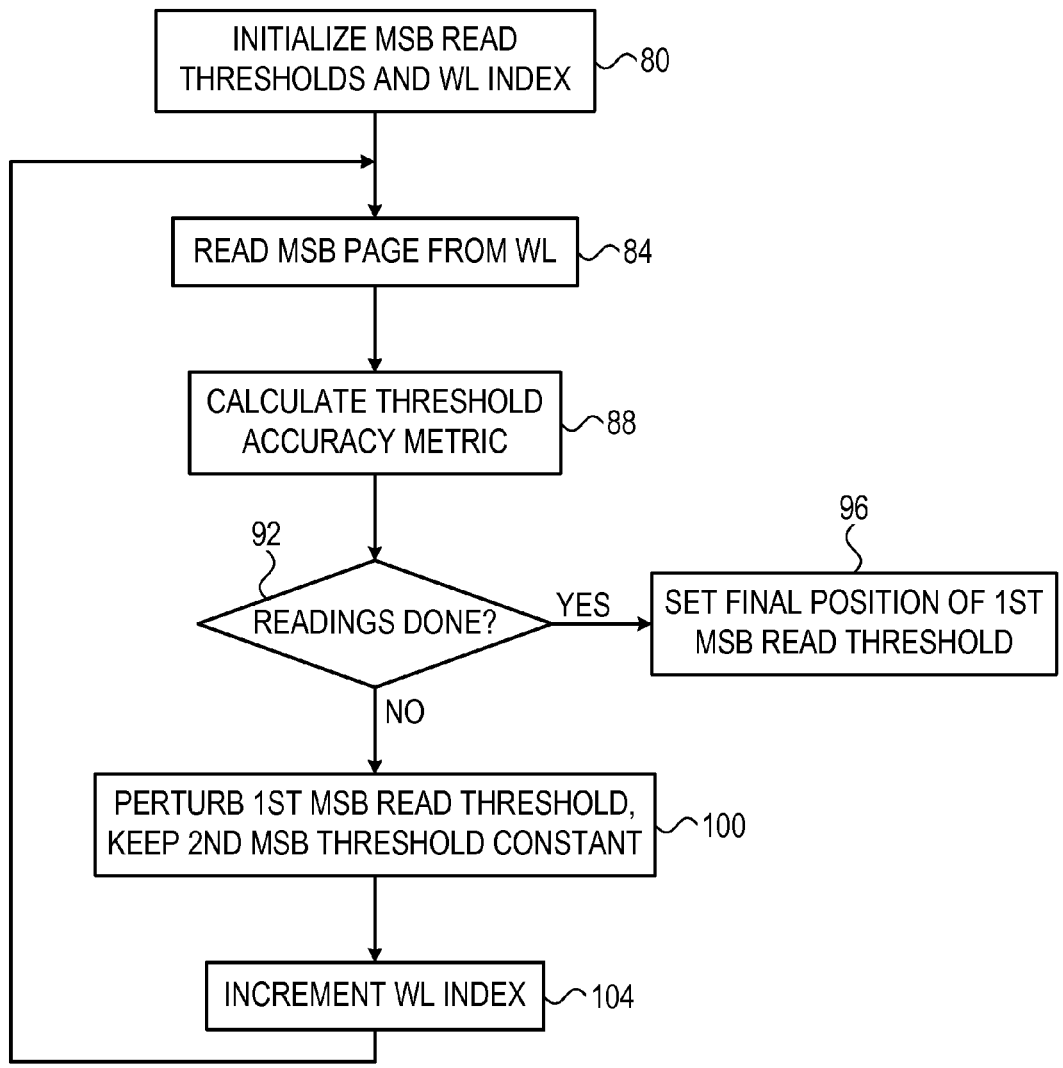
FIG. 4 is a flow chart that schematically illustrates a method for adjusting a read threshold, in accordance with an embodiment that is described herein.

FIG. 4 is a flow chart that schematically illustrates a method for adjusting one of two MSB read thresholds, in accordance with an embodiment that is described herein. For ease of explanation, the flow of FIG. 4 shows a batch process in which processor 48 performs a set of readout operations on different word lines, and then sets the final read threshold position. In alternative embodiments, as described above, processor 48 performs an on-going process that tracks the optimal positions over time.

The method of FIG. 4 begins with processor 48 initializing the MSB read threshold positions and a word line (WL) index, at an initialization step 80. At a readout operation step 84, processor 48 instructs R/W unit 36 to read the MSB page from the WL pointed to by the WL index using the current MSB thresholds. Following the readout operation, processor 48 calculates the threshold-accuracy metric (error metric), at a metric calculation step 88. Processor 48 may calculate any of the error metrics described above, or any other suitable error metric.

At a termination checking step 92, processor 48 checks whether a sufficient number of readout operations has been performed. If so, processor 48 calculates the final position of the read threshold based on the error metrics of the various readout operations, at a setting step 96, and the method terminates.

Otherwise, processor 48 perturbs the MSB threshold that is being evaluated, while keeping the other MSB threshold fixed, at a threshold perturbation step 100. Processor 48 increments the WL index, at a WL incrementing step 104. The method then loops back to step 84 above, in which processor 48 instructs R/W unit 36 to read the MSB page from the next WL using the new read threshold setting.

In an alternative embodiment, the threshold adjustment process may continue indefinitely, with processor 48 continually adapting the read thresholds so as to track their optimal positions.

In the examples described above, all readout operations pertain to the same page type (e.g., MSB page). Generally, however, some correlation often exists between the positions of read-thresholds of different page types. Therefore, in some embodiments the read operations may involve reading of different pages types, and thus involve different types of read thresholds.

In some embodiments, the disclosed techniques can also be used in readout operations that use a single read threshold, e.g., in SLC readout or in LSB readout on an MLC or TLC device. In such embodiments, while performing a sequence of normal readout operations, the memory controller perturbs the read threshold from one read operation to the next. The memory controller calculates a respective error metric for the readout results of each readout operation, and estimates a preferred value for the read threshold based on the error metrics. Any of the error metrics described above can be used for this purpose.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
   an interface configured to communicate with a memory, wherein the memory comprises:
      a memory array comprising multiple word lines, each having multiple memory cells; and
      a read circuit, which is coupled to the memory array and is configured to convert analog values stored in the memory cells into digital samples by comparing the analog values to at least first and second read thresholds; and
   circuitry, configured to:
      instruct the read circuit to store data in the memory cells;
      instruct the read circuit to read the memory cells in a sequence of multiple readout operations that advances sequentially over the word lines, wherein each of the multiple readout operations in the sequence reads the memory cells of a subsequent word line;
      throughout the multiple readout operations, instruct the read circuit to keep the first read threshold fixed and to perturb only the second read threshold between the multiple readout operations from the different word lines; and
      estimate a preferred value for the second read threshold based on the multiple readout operations.

2. The apparatus according to claim 1, wherein the circuitry is configured to estimate multiple respective threshold-accuracy metrics for the readout operations, and to estimate the preferred value based on the threshold-accuracy metrics.

3. A method, comprising:
   storing data in a memory, wherein the memory comprises:
      a memory array comprising multiple word lines, each having multiple memory cells; and
      a read circuit, which is coupled to the memory array and is configured to convert analog values stored in the memory cells into digital samples by comparing the analog values to at least first and second read thresholds;
   instructing the read circuit to read the memory cells in a sequence of multiple readout operations that advances sequentially over the word lines, wherein each of the multiple readout operations in the sequence reads the memory cells of a subsequent word line;
   throughout the multiple readout operations, instructing the read circuit to keep the first read threshold fixed and to perturb only the second read threshold between the readout operations from the different word lines; and
   estimating a preferred value for the second read threshold based on the multiple readout operations.

4. The method according to claim 3, wherein the multiple readout operations comprise normal readout operations that read data in response to requests from a host.

5. The method according to claim 3, wherein estimating the preferred value for the second read threshold comprises estimating respective threshold-accuracy metrics for the readout operations, and estimating the preferred value based on the threshold-accuracy metrics.

6. The method according to claim 5, wherein estimating the threshold-accuracy metrics comprises assessing a respective number of read errors occurring in each of the readout operations.

7. The method according to claim 5, wherein storing the data comprises encoding the data with an Error Correction Code (ECC) that is defined by a set of check equations, and wherein estimating the threshold-accuracy metrics comprises assessing a respective number of the check equations that are satisfied by readout results of each of the readout operations.

8. The method according to claim 5, wherein storing the data comprises encoding the data with an Error Correction Code (ECC), wherein instructing the read circuit to read the memory cells comprises decoding the ECC in a sequence of decoding iterations, and wherein estimating the threshold-accuracy metrics comprises assessing a respective number of the decoding iterations performed in each of the readout operations.

9. The method according to claim 5, wherein storing the data comprises encoding the data with an Error Correction Code (ECC), wherein instructing the read circuit to read the memory cells comprises decoding the ECC using a decoding scheme selected from multiple possible decoding schemes, and wherein estimating the threshold-accuracy metrics comprises assessing the decoding scheme selected in each of the readout operations.

10. The method according to claim 5, wherein estimating the threshold-accuracy metrics comprises assessing a first number of bit errors corrected from "1" to "0", and a second number of bit errors corrected from "0" to "1".

11. The method according to claim 5, wherein estimating the preferred value comprises choosing a direction in which to adjust the second read threshold between readout operations from different word lines, based on the threshold-accuracy metrics.

12. The method according to claim 5, wherein estimating the preferred value comprises choosing an increment size by which to adjust the second read threshold between readout operations from different word lines, based on the threshold-accuracy metrics.

13. The method according to claim 3, wherein storing the data comprises mapping data values to programmed values in accordance with a mapping in which the programmed values representing different data values are distinguishable by two or more read thresholds.

14. An apparatus, comprising:
   an interface configured to communicate with a memory, wherein the memory comprises:
      a memory array comprising multiple word lines, each having multiple memory cells; and
      a read circuit, which is coupled to the memory array and is configured to convert analog values stored in the memory cells into digital samples by comparing the analog values to at least first and second read thresholds; and
   circuitry, configured to:
      store data in the memory cells;
      instruct the read circuit to read the data from the memory cells, in response to a request for the data, in a sequence of multiple readout operations that advances sequentially over the word lines, wherein each of the multiple readout operations in the sequence reads the memory cells of a subsequent word line while perturbing the read threshold between the readout operations from the different word lines; and estimate a preferred value for the read threshold based on the multiple readout operations.

15. The apparatus according to claim 14, wherein the circuitry is configured to estimate respective threshold-accuracy metrics for the readout operations, and to estimate the preferred value based on the threshold-accuracy metrics.

16. A method, comprising:
   storing data in a memory, wherein the memory comprises:
   a memory array comprising multiple word lines, each having multiple memory cells; and
   a read circuit, which is coupled to the memory array and is configured to convert analog values stored in the memory cells into digital samples by comparing the analog values to at least first and second read thresholds;
   in response to a request for the data, instructing the read circuit to read the data from the memory cells in a sequence of multiple readout operations that advances sequentially over the word lines, wherein each of the multiple readout operations in the sequence reads the memory cells of a subsequent word line while perturbing the read threshold between the readout operations from the different word lines; and
   estimating a preferred value for the read threshold based on the multiple readout operations.

17. The method according to claim 16, wherein estimating the preferred value for the read threshold comprises estimating respective threshold-accuracy metrics for the readout operations, and estimating the preferred value based on the threshold-accuracy metrics.

18. The method according to claim 17, wherein estimating the threshold-accuracy metrics comprises assessing a respective number of read errors occurring in each of the readout operations.

19. The method according to claim 17, wherein storing the data comprises encoding the data with an Error Correction Code (ECC) that is defined by a set of check equations, and wherein estimating the threshold-accuracy metrics comprises assessing a respective number of the check equations that are satisfied by readout results of each of the readout operations.

20. The method according to claim 17, wherein storing the data comprises encoding the data with an Error Correction Code (ECC), wherein instructing the read circuit to read the memory cells comprises decoding the ECC in a sequence of decoding iterations, and wherein estimating the threshold-accuracy metrics comprises assessing a respective number of the decoding iterations performed in each of the readout operations.

21. The method according to claim 17, wherein storing the data comprises encoding the data with an Error Correction Code (ECC), wherein instructing the read circuit to read the memory cells comprises decoding the ECC using a decoding scheme selected from multiple possible decoding schemes, and wherein estimating the threshold-accuracy metrics comprises assessing the decoding scheme selected in each of the readout operations.

22. The method according to claim 17, wherein estimating the threshold-accuracy metrics comprises assessing a first number of bit errors corrected from "1" to "0", and a second number of bit errors corrected from "0" to "1".

23. The method according to claim 17, wherein estimating the preferred value comprises choosing a direction in which to adjust the read threshold between readout operations from different word lines, based on the threshold-accuracy metrics.

24. The method according to claim 17, wherein estimating the preferred value comprises choosing an increment size by which to adjust the read threshold between readout operations from different word lines, based on the threshold-accuracy metrics.

* * * * *